US007587005B2

(12) United States Patent
Tran

(10) Patent No.: US 7,587,005 B2
(45) Date of Patent: Sep. 8, 2009

(54) EXPLOITING KNOWN PADDING DATA TO IMPROVE BLOCK DECODE SUCCESS RATE

(75) Inventor: Phat Tran, Waterloo (CA)

(73) Assignee: Research In Motion Limited, Waterloo, ON (*) Notice: Subject to any disclaimer, the term of this patent is extended or adjusted under 35 U.S.C. 154(b) by 582 days.

(21) Appl. No.: 11/390,155

(22) Filed: Mar. 28, 2006

(65) Prior Publication Data

US 2007/0230630 A1 Oct. 4, 2007

(51) Int. Cl.
*H04L 27/06* (2006.01)
*H03D 1/00* (2006.01)
(52) U.S. Cl. .................... 375/341; 375/365
(58) Field of Classification Search ............. 375/262, 375/265, 340–341; 714/792, 795
See application file for complete search history.

(56) References Cited

U.S. PATENT DOCUMENTS 6,356,595 B1* 3/2002 Czaja et al. ............... 375/262
6,519,297 B2* 2/2003 Butler et al. ............... 375/341

OTHER PUBLICATIONS

Martin Bossert, "Channel Coding for Telecommunications", 1999, Wiley, Chichester, XP002395618, p. 217-p. 220.
Juha Korhonen, "Introduction to 3G Mobile Communications", Internet Article, [Online] 2003, XP002394936, retrieved from URL:http://www.elib.hbi.ir/computer/networking/pdf/1580535070-Artech-Introduction%20to%203G%20Mobile%20Communications%202ed.pdf>[retrieved on Aug. 16, 2006], p. 143-p. 146 and p. 145.
Brian K. Butler et al., "The MSM3000TMdu al -mode CDMA + AMPS ASIC: for increased functionality and standby time of handset", Internet Article, [Online] 1999, XP002394937, Retrieved from the internet: URL:http://ieeexplore.ieee.org/iel5/6527/17420/00805241.pdf?arnumber=805241> [retrieved on Aug. 16, 2006], p. 71, col. 1, line 20-line 24.
European Search Report for European patent application No. 06111864.2, issued by the European Patent Office, dated Aug. 22, 2006.

* cited by examiner

*Primary Examiner*—Khanh C Tran
(74) *Attorney, Agent, or Firm*—Ogilvy Renault LLP

(57) ABSTRACT

A method and system of decoding a convolutionally encoded data block having known padding bits. A Viterbi decoder is constrained to a state corresponding to k−1 padding bits immediately adjacent to data bits of the data block, where k is a constraint length of a convolution encoder used to encode the data block. Symbols of the encoded data block that have influence only from the padding bits are discarded.

12 Claims, 4 Drawing Sheets

Start State = 00
k=2

Start State = 11
k=2
S=n/R

End State = 11
k=2
E=[(N-n)+(k-1)]/R

EXPLOITING KNOWN PADDING DATA TO IMPROVE BLOCK DECODE SUCCESS RATE

CROSS-REFERENCE TO RELATED APPLICATIONS

This is the first application filed for the present technique.

MICROFICHE APPENDIX

Not Applicable.

TECHNICAL FIELD

This application relates to communications networks in which known padding data are used to rate adapt data to frames/blocks of different sizes, and in particular to methods and systems for exploiting the known padding data to improve decode success rate of convolutionally encoded blocks.

BACKGROUND

Within the modern network space, it is frequently required to map data from one transmission protocol (or format) to another. For example, within the Enhanced Data for Global Evolution (EDGE) protocol, data can be mapped to/from any of nine different channel coding schemes, depending on the radio link quality. Each coding scheme provides a respective different data throughput (or rate). Consequently, in order to perform a mapping between any two coding schemes, the data must be rate (or size) adapted. In order to do this, padding data are used to match the size of a data block (of the source coding scheme) to the block size of the destination coding scheme.

For example, FIGS. 1a and 1b respective show representative data frames of two different channel coding schemes. As may be seen in the figures, both frames include a respective header and a data block. The header block is substantially identical in both channel encoding scheme, but in the scheme of FIG. 1b, the data block is larger, thereby reflecting a higher data rate than the frame of FIG. 1a. With this arrangement, mapping data from the frame of FIG. 1a into that of FIG. 1b requires the insertion of padding bits into the data block of FIG. 1b so as to make up for the difference between the data capacity of the higher rate frame (FIG. 1b) and the lower rate frame (FIG. 1a). In the example of FIG. 1b, the padding bits are prepended to the data. However, the padding bits may equally be appended to the data, or they may be split; with some padding bits being prepended to the data and the remainder appended to the data.

Typically, the padding data is provided as either a data fill of binary 1's or 0's. In all cases, conventional forward error correction (FEC) schemes are unaware of padding bits within a data block. The entire data block will be encoded (e.g. using convolutional encoding) and decoded (e.g. using a Viterbi decoder) without reference to the presence or absence of padding bits within the data block. Since the padding bits are known in advance, this leads to redundant encoding and decoding operations, and increases the probability of errored data decoding.

It would be desirable to enhance forward error correction of encoded data containing known padding bits by exploiting the fact that these padding bits are known and not only need not be decoded, but can also be used to improve the probability of decode success of the data.

BRIEF DESCRIPTION OF THE DRAWINGS

Further features and advantages of the present technique will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The present disclosure provides methods and apparatus for enhancing forward error correction of convolutionally encoded data containing known padding bits at the beginning and/or at the end of a block. Embodiments are described below, by way of example only, with reference to FIGS. 2-5.

Figure 5:
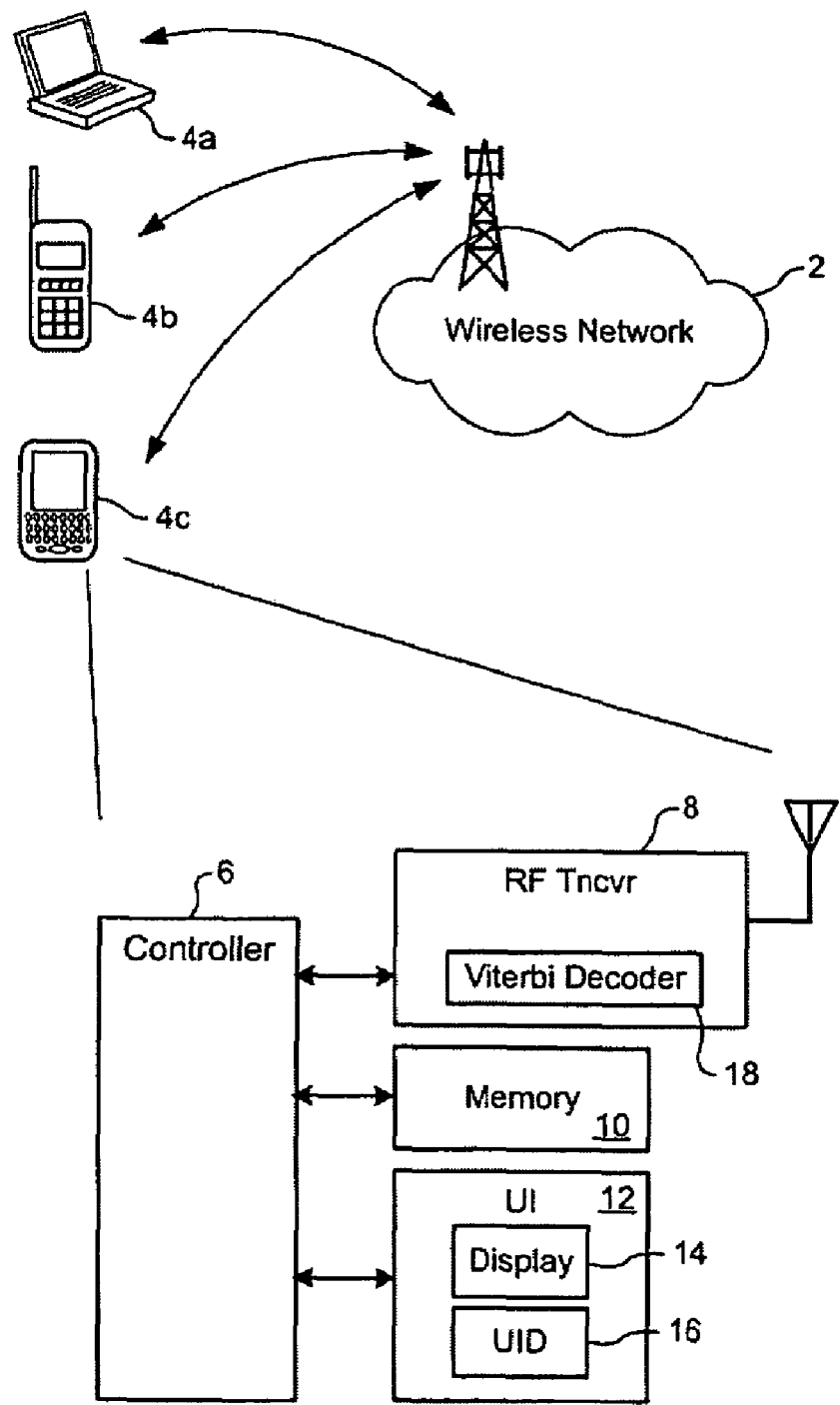
FIG. 5 is a block diagram schematically illustrating a network system.

Referring to FIG. 5, a network in which the present technique may be utilised generally comprises a wireless communications network 2 supporting communications with a plurality of subscriber's terminal devices 4 in a manner generally known in the art. In general, the terminal devices 4 can be any of a wide variety of software-controlled wireless devices including, but not limited to mobile telephones, personal computers and PDAs with wireless communication capabilities, self service kiosks and two-way pagers. As may be seen in FIG. 5, such devices 4 generally comprise a controller (such as a microprocessor) 6 connected to an RF transceiver 8 for wireless communications, a memory 10 (at least a portion of which will normally be non-volatile), and user interface (UI) 12 including a display 14 and one or more user input/output devices (e.g. keyboard, thumb-wheel, stylus, microphone, speaker etc.) 16.

Figure 1A:
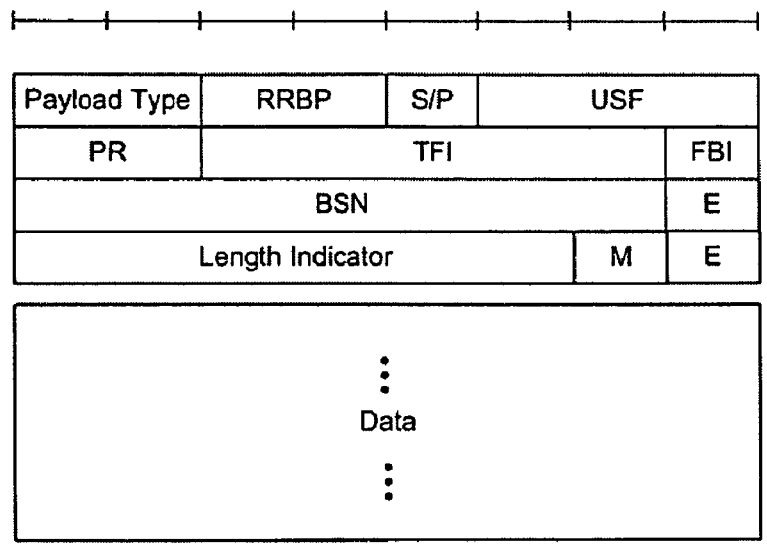
FIGS. 1a and 1b schematically illustrate a representative EDGE data frame, and an EDGE data frame in which padding bits have been prepended to the data for rate adaptation.
Figure 1B:
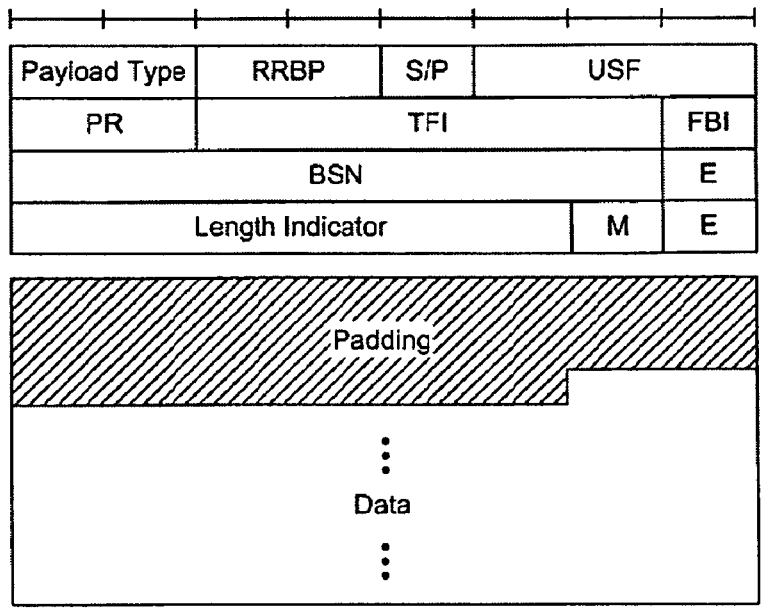
Figure 2:
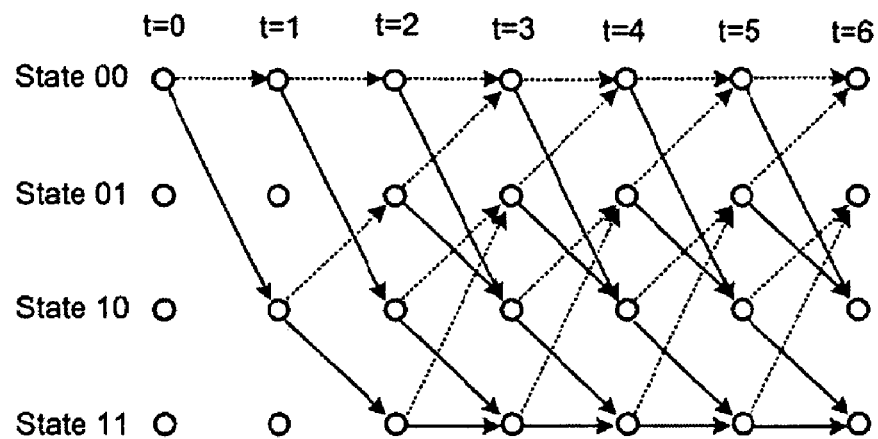
FIG. 2 illustrates a trellis diagram of a conventional viterbi decoder.

As is well known in the art, convolutionally encoded symbols are decoded using a Viterbi decoder 18 which may, for example, be implemented in a terminal device 4. If desired, the Viterbi decoder 18 may be implemented as part of the RF transceiver 8 as shown in FIG. 5, but this is not essential. In general, potential values of the data bits are latched into a shift register of length k−1, where k is the constraint length of the convolutional code. As each potential bit value is latched into the shift register, the corresponding state changes in the decoder are used to yield the expected channel symbols for comparison against the received symbols to determine the most likely state transitions that would have occurred in the encoder at the transmitter end of the link. This process is usually visualized using a trellis diagram. A representative trellis diagram, for the case of k=3, is shown in FIG. 2. The rows of the trellis correspond to states of the shift register, and the columns correspond to the data bits to be decided. Since each state can be reached from at least two prior states, this results in multiple paths being mapped through the trellis diagram. At the end of the message (or message block), a least cost (or highest probability) path of state changes through the trellis diagram is selected, and the original data recovered by means of a trace-back along the selected path through the trellis diagram.

Normally, the decoder is assumed to start at state 0 and is forcibly terminated, through the appending of k−1 tail bits, at state 0. This provides a convenient mechanism for converging both ends of the trellis so that a unique survivor path representing the most likely decode of the received symbols can be chosen.

In the case of rate adaptation between any two of the various coding schemes of the EDGE protocol, for example, the number and location(s) of padding bits within the data block are known, as is the value of each padding bit. With this information, it is possible to skip over decoding of the known padding bits, and constrain the start state and/or the end state of the decoder according to the known values of the padding bits to force the padding bits to be decoded to their known values and thereby improve accuracy of the decoding operation.

Figure 3:
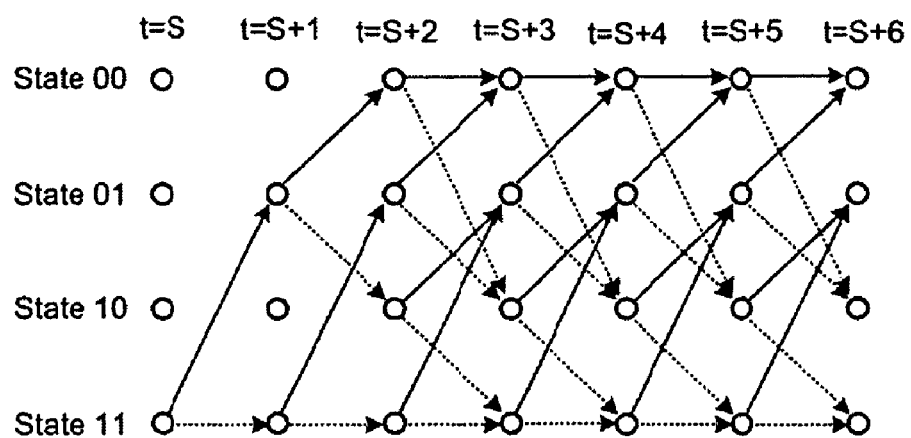
FIG. 3 illustrates a trellis diagram of a viterbi decoder in accordance with a first embodiment of the present technique.

FIG. 3 illustrates a trellis diagram in which the start state of the decoder is constrained by the last k−1 bits of prepended padding bits. For example, consider a data block having a total length of N bits, including n prepended padding bits. In this case, the first n bits of the transmitted data block can be latched into the shift register of the Viterbi decoder at the receiving end without being decoded. This can be done because the first n bits are known padding bits. This results in the shift register containing bits corresponding to the last k−1 bits of padding data, and the next bit to be decided by the Viterbi decoder will be the first bit of "actual" data. By setting the start state of decoder to the last k−1 bits of the prepended padding data, which are already known, decoding can skip over the first S=n/R symbols (where R is the code rate of the convolutional encoder) and start with the immediately following symbol, which would be the first symbol that has influence from actual data in the convolutionally encoded block. Decoding can then continue in a conventional manner. With this arrangement, only the actual data bits contribute to the number of candidate paths through the trellis diagram, and any erroneous paths that would have been constructed by the incorrect decoding of any of the padding bits are automatically pruned in advance.

Figure 4:
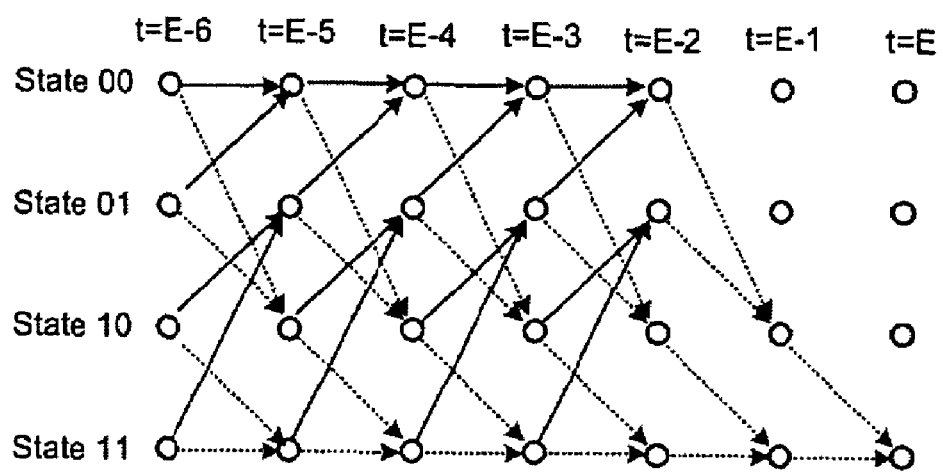
FIG. 4 illustrates a trellis diagram of a viterbi decoder in accordance with a second embodiment of the present technique.

FIG. 4 illustrates a trellis diagram in which the end state is constrained by the first k−1 bits of appended padding bits. For example, consider a data block having a total length of N bits, including n appended padding bits. In this case, the first (N−n) bits are candidates for Viterbi decoding according to paths mapped through the trellis diagram from the processing of the first e=(N−n)+(k−1) received bits. To force a path to emerge as the most likely (least cost) decode, the trellis is made to converge on a known state dictated by the first k−1 bits of appended padding bits. This flushes all bits corresponding to "real" data out of the shift register, and leaves the shift register loaded with bits corresponding to the first k−1 padding bits. The remaining symbols of the encoded data block, all of which are determined only by padding bits, can be discarded without decoding. Traceback and decoding of the data bits can then proceed in a conventional manner, but starting from the known end state of the decoder as determined by the known first k−1 padding bits. With this arrangement, only the actual data bits contribute to the number of candidate paths through the trellis diagram, and any erroneous paths that would have been constructed by the incorrect decoding of any of the padding bits are automatically pruned in advance.

It will be appreciated that the methods described above with reference to FIGS. 3 and 4 can be combined for the case of a data block in which both prepended and appended padding bits are used for rate adaptation.

By constraining the decoder in the above-noted manner, the decoder only decodes bits corresponding to actual data. This improves decoder performance by minimizing the number of bits that need to be decoded in order to recover the data from a data block. In addition, decoding accuracy of the data is improved, because selection of the highest probability path for traceback and decoding is not perturbed by (possibly erroneously) decoded padding bits.

The conventional approach to using known data in Viterbi decoding involves trellis pruning to exclude non-candidate paths. However, implementation of a Viterbi decoder that supports arbitrary trellis pruning is complicated. The present technique is much more useful in practice because it is easy to implement a Viterbi decoder with selectable start and/or end states.

The embodiments) described above is(are) intended to be representative only. The scope of the present application is therefore intended to be limited solely by the scope of the appended claims.

We claim:

1. A method of decoding a convolutionally encoded data block having known padding bits, the method for use in a controller and comprising steps of:

constraining a Viterbi decoder to a state corresponding to k−1 padding bits immediately adjacent data bits of the data block, where k is a constraint length of a convolutional encoder used to encode the data block; and discarding symbols of the encoded data block that have influence only from the padding bits, wherein the Viterbi decoder is connected to the controller.

2. A method as claimed in claim 1, wherein at least a portion of the padding bits are prepended to the data bits, and wherein the step of constraining the Viterbi decoder comprises a step of constraining a Start state of the decoder to a state corresponding to the last k−1 padding bits prepending the data bits.

3. A method as claimed in claim 2, wherein the step of discarding symbols of the encoded data block comprises steps of:

latching the known padding bits of the data block into a shift register of the Viterbi decoder, without decoding the known padding bits; and starting the Viterbi decoder at the first symbol after the first S=n/R symbols of the encoded data block, where n is the number of prepended padding bits, and R is the code rate of the convolutional encoder.

4. A method as claimed in claim 1, wherein at least a portion of the padding bits are appended to the data bits, and wherein the step of constraining the Viterbi decoder comprises a step of constraining an End state of the decoder to a state corresponding to the first k−1 padding bits appending the data bits.

5. A method as claimed in claim 4, wherein the step of discarding symbols of the encoded data block comprises steps of:

processing a sufficient number of symbols of the encoded data block through the Viterbi decoder to flush the bit corresponding to the last data bit out of the shift register; and discarding any remaining symbols of the data block.

6. A method as claimed in claim 5, wherein the step of processing a sufficient number of symbols of the encoded data block through the Viterbi decoder comprises a step of processing the first e=(N−n) (k−1) bits of the encoded data block through the Viterbi decoder, wherein N is the total number of bits capacity of the data block, and n is the total number of padding bits appended to the data bits.

7. A system for decoding a convolutionally encoded data block having known padding bits, the system comprising:
   a Viterbi decoder; and
   a controller adapted to:
      constrain the Viterbi decoder to a state corresponding to k−1 padding bits immediately adjacent data bits of the data block, where k is a constraint length of a convolution encoder used to encode the data block; and
      discard symbols of the encoded data block that have influence only from the padding bits.

8. A system as claimed in claim 7, wherein at least a portion of the padding bits are prepended to the data bits, and wherein the controller is adapted to constraining a start state of the decoder to a state corresponding to the last k−1 padding bits prepending the data bits.

9. A system as claimed in claim 8, wherein the controller is adapted to discard symbols of the encoded data block that have influence only from the padding bits by:
   disabling operation of the Viterbi decoder while latching the known padding bits of the data block into a shift register of the Viterbi decoder; and
   enabling the Viterbi decoder at the first symbol after the first $S=n/R$ symbols of the encoded data block, where n is the number of prepended padding bits, and R is the code rate of the convolutional encoder.

10. A system as claimed in claim 7, wherein at least a portion of the padding bits are appended to the data bits, and wherein the controller is adapted to constrain an End state of the decoder to a state corresponding to the first k−1 padding bits appending the data bits.

11. A system as claimed in claim 10, wherein the controller is adapted to discard symbols of the encoded data block that have influence only from the padding bits by:
   processing a sufficient number of symbols of the encoded data block through the Viterbi decoder to flush the bit corresponding to the last data bit out of the shift register; and
   discarding any remaining symbols of the data block.

12. A system as claimed in claim 11, wherein processing a sufficient number of symbols of the encoded data block through the Viterbi decoder comprises processing the first $e=(N-n)+(k-1)$ bits of the encoded data block through the Viterbi decoder, wherein N is the total number of bits capacity of the data block, and n is the total number of padding bits appended to the data bits.

* * * * *

UNITED STATES PATENT AND TRADEMARK OFFICE
CERTIFICATE OF CORRECTION

PATENT NO. : 7,587,005 B2  Page 1 of 1
APPLICATION NO. : 11/390155
DATED : September 8, 2009
INVENTOR(S) : Phat Tran It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 746 days.

Signed and Sealed this

Twenty-first Day of September, 2010

David J. Kappos
*Director of the United States Patent and Trademark Office*